(12) United States Patent
Averbuj et al.

(10) Patent No.: US 7,814,380 B2
(45) Date of Patent: *Oct. 12, 2010

(54) BUILT-IN SELF TEST (BIST) ARCHITECTURE HAVING DISTRIBUTED INTERPRETATION AND GENERALIZED COMMAND PROTOCOL

(75) Inventors: Roberto Fabian Averbuj, San Diego, CA (US); David W. Hansquine, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/122,702

(22) Filed: May 18, 2008

(65) Prior Publication Data

US 2008/0215944 A1    Sep. 4, 2008

Related U.S. Application Data

(63) Continuation of application No. 10/630,480, filed on Jul. 29, 2003, now Pat. No. 7,392,442.

(51) Int. Cl.
*G11C 29/00* (2006.01)
(52) U.S. Cl. ........................ 714/718; 702/118
(58) Field of Classification Search ......... 714/718–723; 365/200–201; 702/118
See application file for complete search history.

(56) References Cited

U.S. PATENT DOCUMENTS

| 5,224,101 | A |  | 6/1993 | Popyack, Jr. |
| 5,617,531 | A | * | 4/1997 | Crouch et al. ............... 714/30 |
| 5,633,877 | A |  | 5/1997 | Shephard, III et al. |
| 5,661,732 | A |  | 8/1997 | Lo et al. |
| 5,675,545 | A |  | 10/1997 | Madhavan et al. |
| 5,995,731 | A |  | 11/1999 | Crouch et al. |
| 6,249,889 | B1 |  | 6/2001 | Rajsuman et al. |
| 6,272,588 | B1 |  | 8/2001 | Johnston et al. |
| 6,327,556 | B1 |  | 12/2001 | Geiger et al. |
| 6,347,056 | B1 | * | 2/2002 | Ledford et al. ............. 365/201 |
| 6,349,398 | B1 |  | 2/2002 | Resnick |

(Continued)

FOREIGN PATENT DOCUMENTS

WO    02075337    9/2002

OTHER PUBLICATIONS

"Hierarchical boundary-scan: a Scan Chip-Set solution" by Harrison et al. This paper appears in: Test Conference, 2001. Proceedings. International Publication Date: 2001 on pp. 480-486 ISBN: 0-7803-7169-0 INSPEC Accession No. 7219850.*

(Continued)

*Primary Examiner*—Cynthia Britt
(74) *Attorney, Agent, or Firm*—Nicholas J. Pauley; Peter M. Kamarchik; Sam Talpalatsky

(57) ABSTRACT

Built-in self-test (BIST) architecture having distributed interpretation and generalized command protocol is disclosed. In an embodiment, a system is disclosed and includes a centralized built-in self-test (BIST) controller configured to store an algorithm to test a plurality of memory modules. The BIST controller stores the algorithm as a set of generalized commands that conform to a command protocol. The BIST controller is configured to send the set of generalized commands to a sequencer.

20 Claims, 11 Drawing Sheets

U.S. PATENT DOCUMENTS

| | | | |
|---|---|---|---|
| 6,388,919 | B2 | 5/2002 | Terasaki |
| 6,415,403 | B1 | 7/2002 | Huang et al. |
| 6,643,804 | B1 | 11/2003 | Aipperspach et al. |
| 6,658,611 | B1 | 12/2003 | Jun |
| 6,665,817 | B1 | 12/2003 | Rieken |
| 6,829,740 | B2 | 12/2004 | Rajski et al. |
| 6,874,111 | B1 | 3/2005 | Adams et al. |
| 6,934,205 | B1 * | 8/2005 | Pandey et al. ............... 365/201 |
| 7,062,689 | B2 | 6/2006 | Slobodnik |
| 7,184,915 | B2 * | 2/2007 | Hansquine et al. .......... 702/118 |
| 7,392,442 | B2 * | 6/2008 | Averbuj et al. .............. 714/718 |
| 7,461,304 | B1 * | 12/2008 | Rosen ........................ 714/700 |
| 2002/0199139 | A1 | 12/2002 | Dortu et al. |
| 2003/0115525 | A1 | 6/2003 | Hill et al. |

OTHER PUBLICATIONS

Tulloss, R.E.; Yau, C.W.; , "BIST and boundary-scan for board level test: test program pseudocode," European Test Conference, 1989., Proceedings of the 1st , vol., No., pp. 106-111, Apr. 12-14 doi: 10.1109/ETC.1989.36230.*

Chuang Cheng; Chih-Tsun Huang; Jing-Reng Huang; Cheng-Wen Wu; Chen-Jong Wey; Ming-Chang Tsai; , "Brains: a BIST compiler for embedded memories," Defect and Fault Tolerance in VLSI Systems, 2000. Proceedings. IEEE International Symposium on , vol., No., pp. 299-307, 2000 doi: 10.1109/DFTVS.2000.887170 .*

Chih-Tsun Huang; Jing-Reng Huang; Chi-Feng Wu; Cheng-Wen Wu; Tsin-Yuan Chang; , "A programmable Bist core for embedded DRAM," Design & Test of Computers, IEEE , vol. 16, No. 1, pp. 59-70, Jan.-.Mar 1999 doi: 10.1109/54.748806.*

International Search Report - OCT/US04/008664 - ISA/EPO - Aug. 23, 2004.

Written Opinion - OCT/US04/008664 - ISA/EPO - Aug. 23, 2004.

* cited by examiner

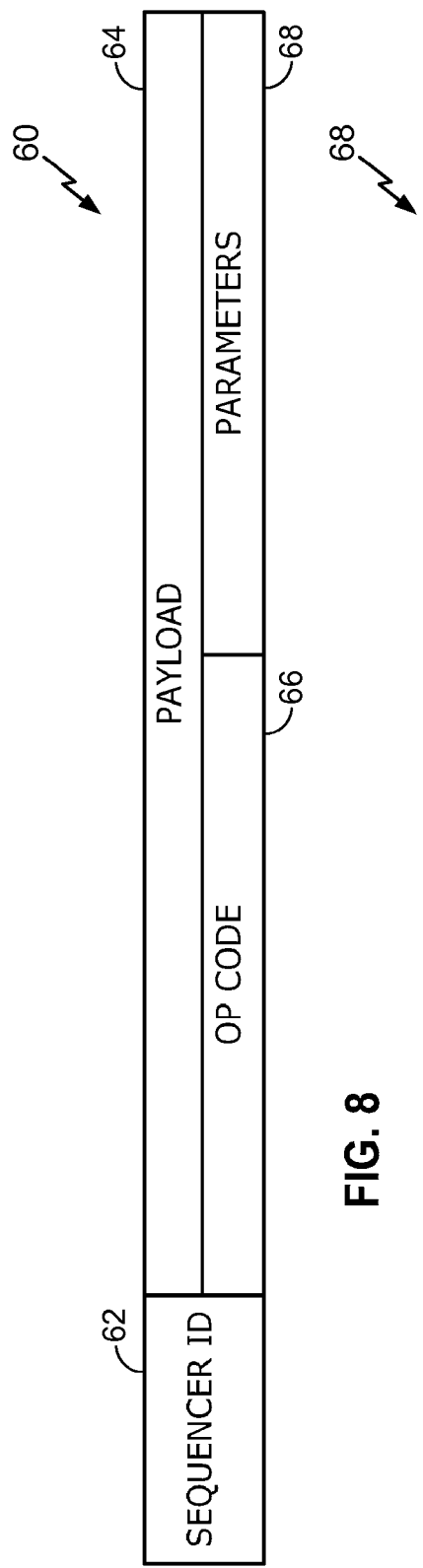
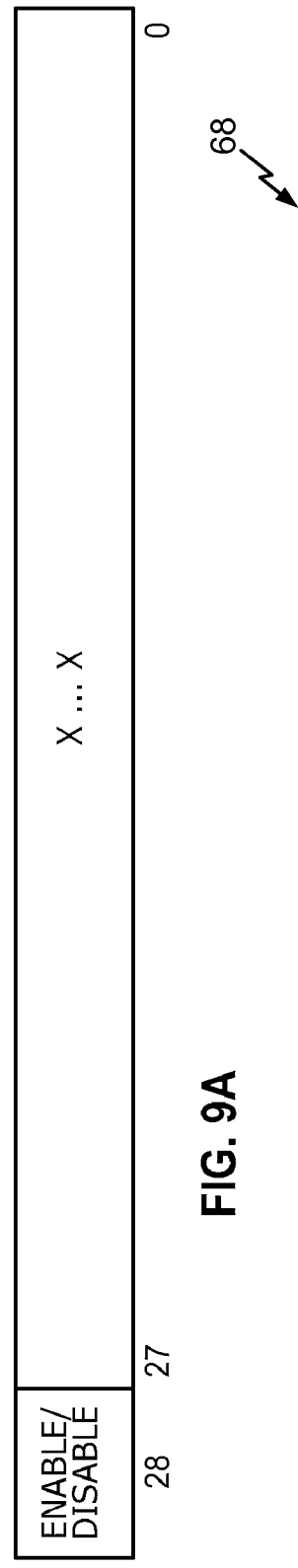
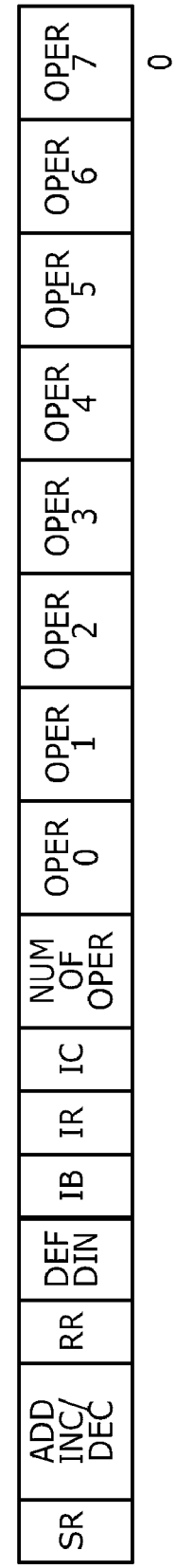
FIG. 8
FIG. 9A
FIG. 9B

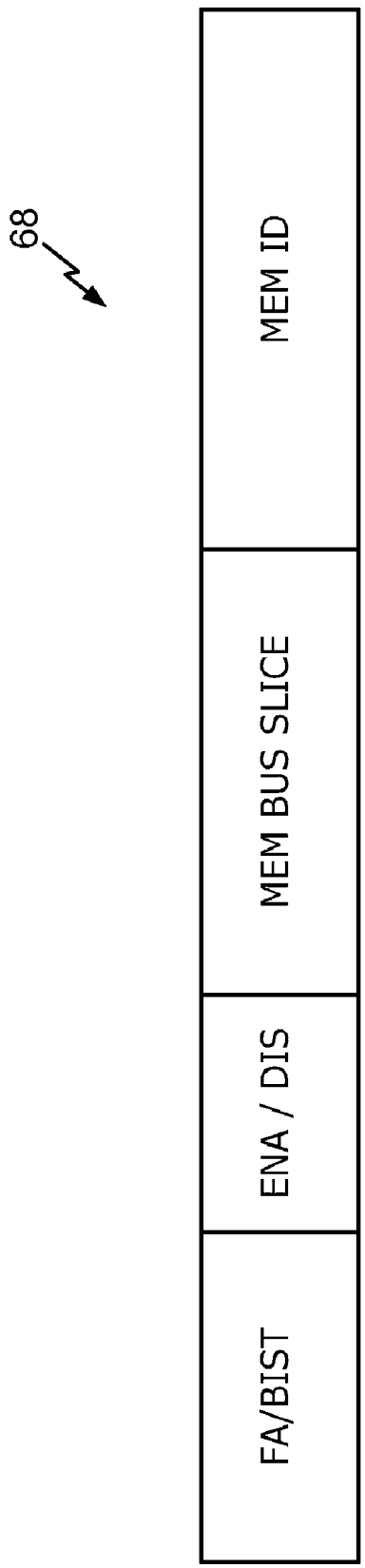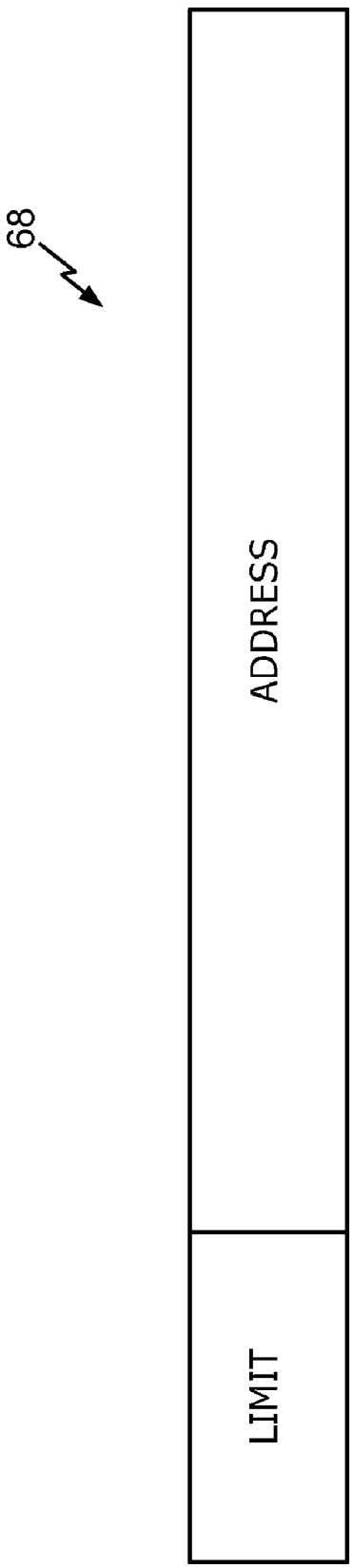
FIG. 9C
FIG. 9D

US 7,814,380 B2

BUILT-IN SELF TEST (BIST) ARCHITECTURE HAVING DISTRIBUTED INTERPRETATION AND GENERALIZED COMMAND PROTOCOL

I. CLAIM OF PRIORITY

This application claims the benefit of U.S. application Ser. No. 10/630,480 entitled "Built-In Self-Test (BIST) Architecture Having Distributed Interpretation and Generalized Command Protocol," filed Jul. 29, 2003, and incorporated by reference in its entirety herein. This application also claims the benefit of U.S. Provisional Application Ser. No. 60/456,451, entitled "Distributed Implementation of a Memory Built-in Self-Test Algorithm Interpreter," filed Mar. 20, 2003.

II. FIELD

The disclosure relates to electronic devices and, in particular, built-in self-test architectures for use in electronic devices.

III. DESCRIPTION OF RELATED ART

Built-in self-test (BIST) units are now commonly incorporated into memory chips and other integrated circuits to test their functionality and reliability. For example, a BIST unit incorporated into a particular memory module operates by writing and reading various data patterns to and from the associated memory module to detect any possible memory faults. By comparing the data written and the data subsequently returned from the memory module, the BIST unit is able to determine whether any memory cell of the memory module is faulty.

The integrated BIST unit typically generates a variety of predetermined test patterns and asserts or deasserts an output signal based on the results of the memory test. A variety of algorithms may be used for detecting memory faults. For example, test patterns of all zeros, all ones, or a "checkerboard" pattern having alternating zeros and ones may be written throughout the memory cells. Moreover, the data may be written to the cells in any order, such as consecutively in an increasing or decreasing addressing scheme.

Thus, BIST units are commonly included in many types of integrated circuits that use or otherwise incorporate memory modules and operate according to some predetermined algorithm to verify the functionality of the internal chip circuitry. However, electronic devices typically comprise more than the internal circuitry of a single chip. Normally they are constructed from many integrated circuit chips and many supporting components mounted on a circuit board.

As the complexity of a typical computing device increases, the number of memory chips and other integrated circuits increases. For example, conventional computing devices typically include a plurality of the memory modules, which are often of different types. The memory modules within a single computing device may include various combinations of random access memory (RAM), read-only memory (ROM), Flash memory, dynamic random access memory (DRAM), and the like. These various types of memory modules often require different testing procedures, and have different bit densities, access speeds, addressing requirements, access protocols, and other particularities. As a result, a typical computing device may have a respective BIST unit for each memory module, and each BIST unit may be particularized to test the associated memory module.

IV. SUMMARY

In general, the disclosure is directed to a distributed, hierarchical built-in self-test (BIST) architecture for testing the operation of one or more memory modules. As described, the architecture includes three tiers of abstraction: a centralized BIST controller, a set of sequencers, and a set of memory interfaces coupled to memory modules.

The BIST controller provides centralized, high-level control over the testing of the memory modules. The BIST controller communicates centrally stored and maintained test algorithms to the sequencers for application to the memory modules. The BIST controller communicates the algorithms as a set of generalized commands that conform to a command protocol described herein. Moreover, the command protocol allows algorithms to be generically defined without regard to any timing requirements, physical organization or particular interface characteristics of the memory modules. As a result, a variety of test algorithms may easily be defined and centrally-maintained for distribution throughout an electronic device as needed. Consequently, common test patterns need not be redundantly stored within memory modules.

The sequencers provide a second level of abstraction. The sequencers are distributed within device blocks that include one or more memory modules. In this manner, each sequencer is associated with one or more memory modules. The sequencers receive the high-level commands from BIST controller. In response to the commands, the sequencers issue a sequence of one or more memory operations to their respective memory interfaces to carry out the commands. For example, a sequencer may issue commands to sequentially access a range of addresses in response to a single command from the BIST controller. The sequencers report the results of the tests to the BIST controller.

The sequencers control the application of the operations in accordance with the timing characteristics of their respective memory modules. For example, each of the sequencers controls the application speed of the sequence of operations in accordance with the access speed of the respective memory module. A single sequencer may control the application of the test algorithms to a plurality of memory modules that operate on a common clock domain. Consequently, logic for controlling application timing and sequencing of the test pattern domain is incorporated within the sequencers, and need not be distributed within the individual memory modules or maintained by the BIST controller.

The third tier, the memory interfaces, handles specific interface requirements for each of the memory modules. Each of the memory interfaces may be designed in accordance with the particular signal interface requirements and physical characteristics of the respective one of memory modules. Each memory interface receives memory operations from a controlling sequencer, and translates the memory operations, including associated address and data signals, as needed based on the physical characteristics of the respective memory module. For example, a memory interface may translate addresses supplied by the controlling sequencer based on the rows and columns of the memory module to fill a memory in a row-wise or column-wise fashion. As another example, the memory interface may translate the data to create specific bit patterns, such as a checkerboard pattern or as "striped" rows or columns in which adjacent rows or columns have opposing patterns.

In an embodiment, a system is disclosed and includes a centralized built-in self-test (BIST) controller configured to store an algorithm to test a plurality of memory modules. The BIST controller stores the algorithm as a set of generalized commands that conform to a command protocol. The BIST controller is configured to send the set of generalized commands to a sequencer.

In another embodiment, an apparatus is disclosed and includes a sequencer configured to receive an algorithm from a built-in self-test (BIST) controller. The algorithm includes a set of generalized commands that conform to a command protocol. The sequencer is further configured to interpret the commands based on the command protocol and to apply the algorithm to an associated memory module.

In another embodiment, a method is disclosed and includes sending an algorithm from a centralized controller by issuing generalized commands that conform to a command protocol to test a plurality of memory modules. The commands are interpreted by a distributed set of sequencers to apply the commands as one or more sequences of memory operations in accordance with the command protocol.

In another embodiment, a system comprises a centralized built-in self-test (BIST) controller that stores an algorithm for testing a plurality of memory modules, wherein the BIST controller stores the algorithm as a set of generalized commands that conform to a command protocol. The system further comprises a plurality of distributed sequencers that interpret the commands and apply the commands to the memory modules.

In another embodiment, a device comprises a centralized built-in self-test (BIST) control means for issuing commands that conform to a generalized command protocol and define a BIST algorithm for testing a plurality of distributed memory modules having different timing requirements and physical characteristics, and distributed means for interpreting the commands and applying the commands to the memory modules in accordance with timing requirements and physical characteristics of the memory modules.

In another embodiment, a method comprises issuing an algorithm from a centralized controller and in the form of generalized commands that conform to a command protocol to test a plurality of memory modules, and interpreting the commands with a distributed set of sequencers to apply the commands as one or more sequences of memory operations in accordance with the command protocol.

The techniques described herein may achieve one or more advantages. For example, the techniques may allow a variety of test algorithms to easily be defined and maintained centrally in the form of generalized commands. The generalized commands can be distributed to sequencers located throughout an electronic device for interpretation and application to memory modules. As a result, common test algorithms need not be redundantly stored within the memory modules.

In addition, the techniques may provide for the simultaneous application of algorithms to different memory modules, which may reduce overall test time and more thoroughly test for inter-memory effects. Moreover, the distributed, hierarchical nature of the architecture may allow the techniques to be readily applied to existing chip designs.

The details of one or more embodiments are set forth in the accompanying drawings and the description below. Other features, objects, and advantages will be apparent from the description and drawings, and from the claims.

V. BRIEF DESCRIPTION OF DRAWINGS

FIG. 8 is a block diagram illustrating an example data structure of a command issued by the BIST controller.

FIGS. 9A-9E illustrate exemplary data structures in accordance with the command protocol described herein.

VI. DETAILED DESCRIPTION

Figure 1:
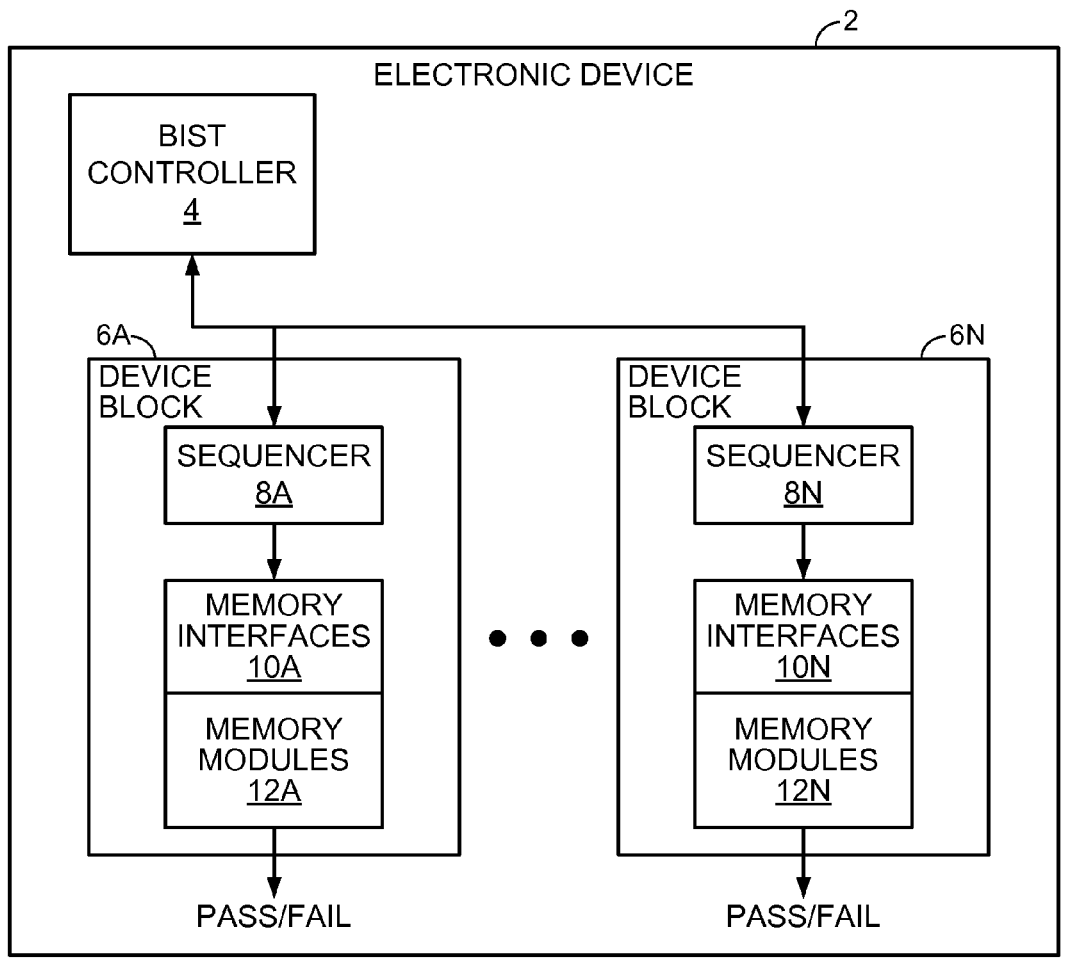
FIG. 1 is a block diagram illustrating an example electronic device having a distributed, hierarchical built-in self-test (BIST) architecture.

FIG. 1 is a block diagram illustrating an example electronic device 2 having a distributed, hierarchical built-in self-test (BIST) architecture. In particular, electronic device 2 includes a built-in self-test (BIST) controller 4 that provides centralized, high-level control over testing of device blocks 6A through 6N (collectively "device blocks 6"). Each of device blocks 6 includes a sequencer 8, and a set of one or more memory interfaces 10 and one or more respective memory modules 12.

In general, BIST controller 4 provides and communicates test algorithms to sequencers 8 for application to device blocks 6. BIST controller 4 communicates each of the algorithms to sequencers 8 as a set of commands that conform to a generic and flexible command protocol. Each command specifies an operational code and a set of parameters that define one or more memory operations without regard to the physical characteristics or timing requirements of memory modules 12. In this manner the command protocol allows a variety of test algorithms to easily be defined and distributed throughout electronic device 2. Consequently, BIST controller 4 provides centralized control over the maintenance and distribution of the algorithms. As a result, common test algorithms need not be redundantly stored within device blocks 6.

Sequencers 8 interpret and execute the test algorithms provided by BIST controller 4. In particular, sequencers 8 receive high-level commands from BIST controller 4 that define a complete BIST algorithm. A single command, for example, may define a particular bit pattern to be written over a range of one or more addresses. In response to the commands, each of sequencers 8 issues one or more sequences of memory operations to their respective memory interfaces 10 to perform the commands. Moreover, sequencers 8 control the application of the operations in accordance with the timing characteristics of their respective memory modules 12. For example, each of sequencers 8 controls the application speed of the sequence of operations in accordance with the access speed of the respective memory module 12. A single sequencer 8, e.g., sequencer 8A, may control the application of the test algorithms to one or more memory modules, e.g., memory modules 12A, that operate on a common clock domain. Memory modules 12 may be grouped and assigned to respective sequencers 8 based on any of a variety of criteria, such as clock domains for each of the memory modules and any pre-existing hierarchy or grouping of the memory modules. Consequently, logic for controlling application timing and sequencing of the test pattern for memory modules 12 operating on a common clock domain may be incorporated within a common sequencer 8, and need not be distributed within the individual memory modules.

Memory interfaces 10 handle specific interface requirements for each of memory modules 12. For example, each of memory interfaces 10 may be designed in accordance with the particular signal interface requirements and physical characteristics of the respective one of memory modules 12. As a result, each of memory interfaces 10 may be viewed as providing an interface "wrapper" around the particular interface signals, e.g., address, data, and control signals, for each respective memory module 12. In this manner, the BIST architecture of electronic device 2 comprises a three-tier, distributed arrangement including BIST controller 4, sequencers 8, and memory interfaces 10.

Memory modules 12 may be any type of memory, such as random access memory (RAM), read-only memory (ROM), Flash memory, dynamic random access memory (DRAM), SDRAM, RDRAM, DDR-RAM, combinations thereof, and the like, and the techniques described herein are not limited in this regard. Moreover, electronic device 2 may be any device that incorporates memory modules, such as an embedded computing system, a computer, server, personal digital assistant (PDA), mobile computing device, mobile communication device, digital recording device, network appliance, mobile positioning device, and the like.

Figure 2:
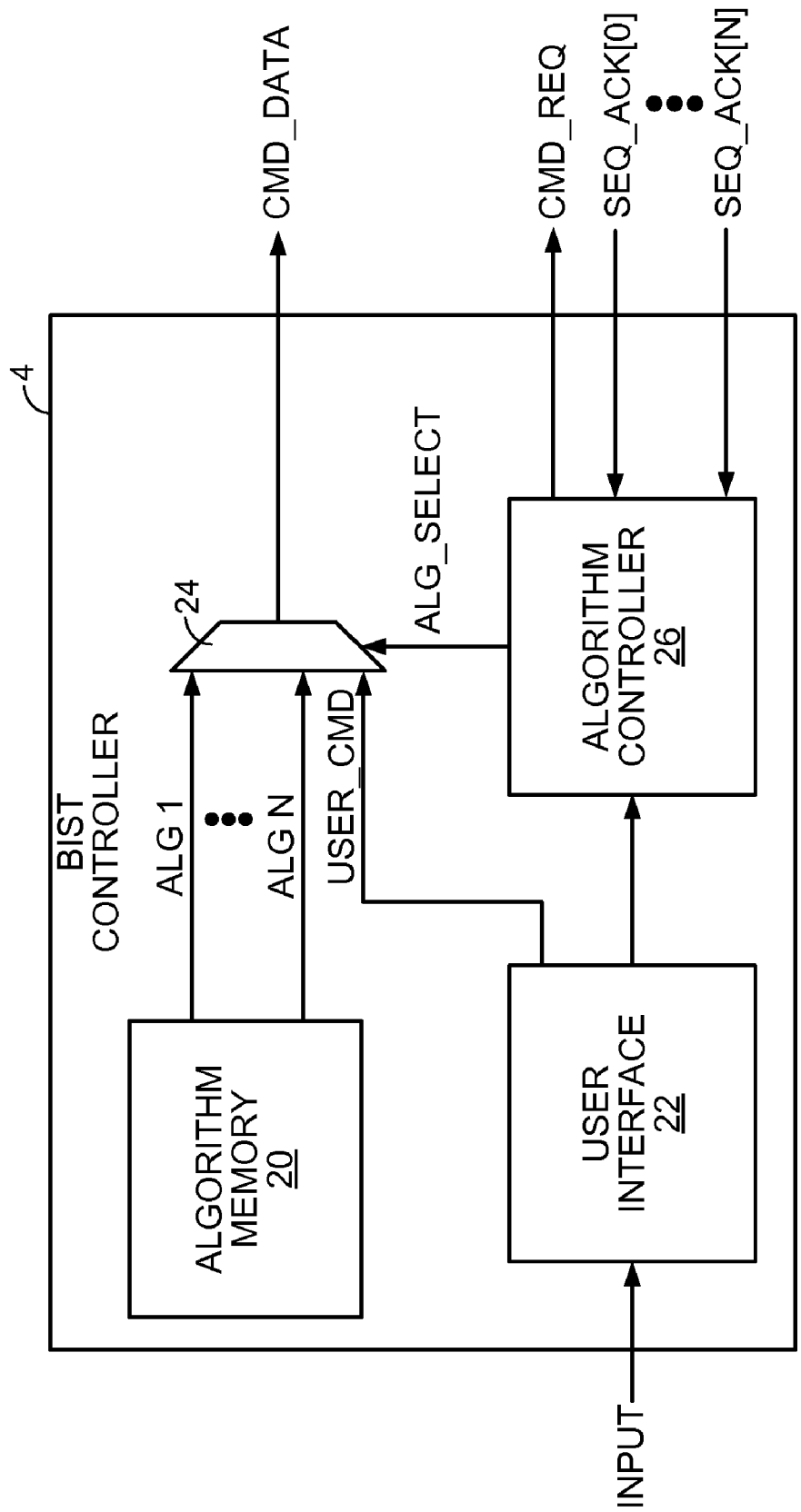
FIG. 2 is a block diagram illustrating an example embodiment of a BIST controller.

FIG. 2 is a block diagram illustrating an example embodiment of BIST controller 4. In this illustrated embodiment, BIST controller 4 includes an algorithm memory 20 that stores a set of N test algorithms. As described below, each algorithm is defined in accordance with a set of binary commands. In one embodiment, for example, a complete algorithm may be specified by a set of 32-bit commands, where the commands define all necessary parameters for performing one or more sequences of memory operations over address ranges of device blocks 6 (FIG. 1) to test the functionality of memory modules 12.

User interface 22 invokes algorithm controller 26 in response to external input, such as a control signal from an external testing apparatus. Alternatively, algorithm controller may be automatically invoked upon power-up of electronic device 2. Once invoked, algorithm controller 26 provides an algorithm select signal (ALG_SELECT) to multiplexer 24 to select one of the algorithms stored within algorithm memory 20. Once selected, a stream of binary commands that comprises the selected algorithm is applied to device blocks 6 as command data (CMD_DATA).

Algorithm controller 26 controls the delivery of the algorithms to device blocks 6 based on acknowledge signals (SEQ_ACK) received from each sequencer 8 of the device blocks. In particular, algorithm controller 26 sequentially delivers each command of the selected algorithm to sequencers 8, and proceeds from one command to the next upon receiving an acknowledge signal from each of sequencers 8. In this manner, algorithm controller 26 ensures that each sequencer 8 has completed application of a current command to memory modules 12 via memory interfaces 10 before proceeding to the next command. Algorithm controller 26 may be programmatically or statically configured to establish the number of device blocks 6 and, in particular, sequencers 8 that are present within electronic device 2. In addition, algorithm controller 26 may be programmatically configured to apply a given algorithm to one, all, or any combination of memory modules 12 using any combination of device blocks 6.

In addition to the algorithms stored in algorithm memory 20, user interface 22 may programmably receive algorithms via external input. User interface 22 delivers the received algorithms to multiplexer 24 in a form similar to that of the stored algorithms, i.e., a sequence of binary commands in which each command defines a test within the overall algorithm. In this manner, BIST controller 4 provides a centralized, first tier of the three-tier, distributed self-test architecture.

Figure 3:
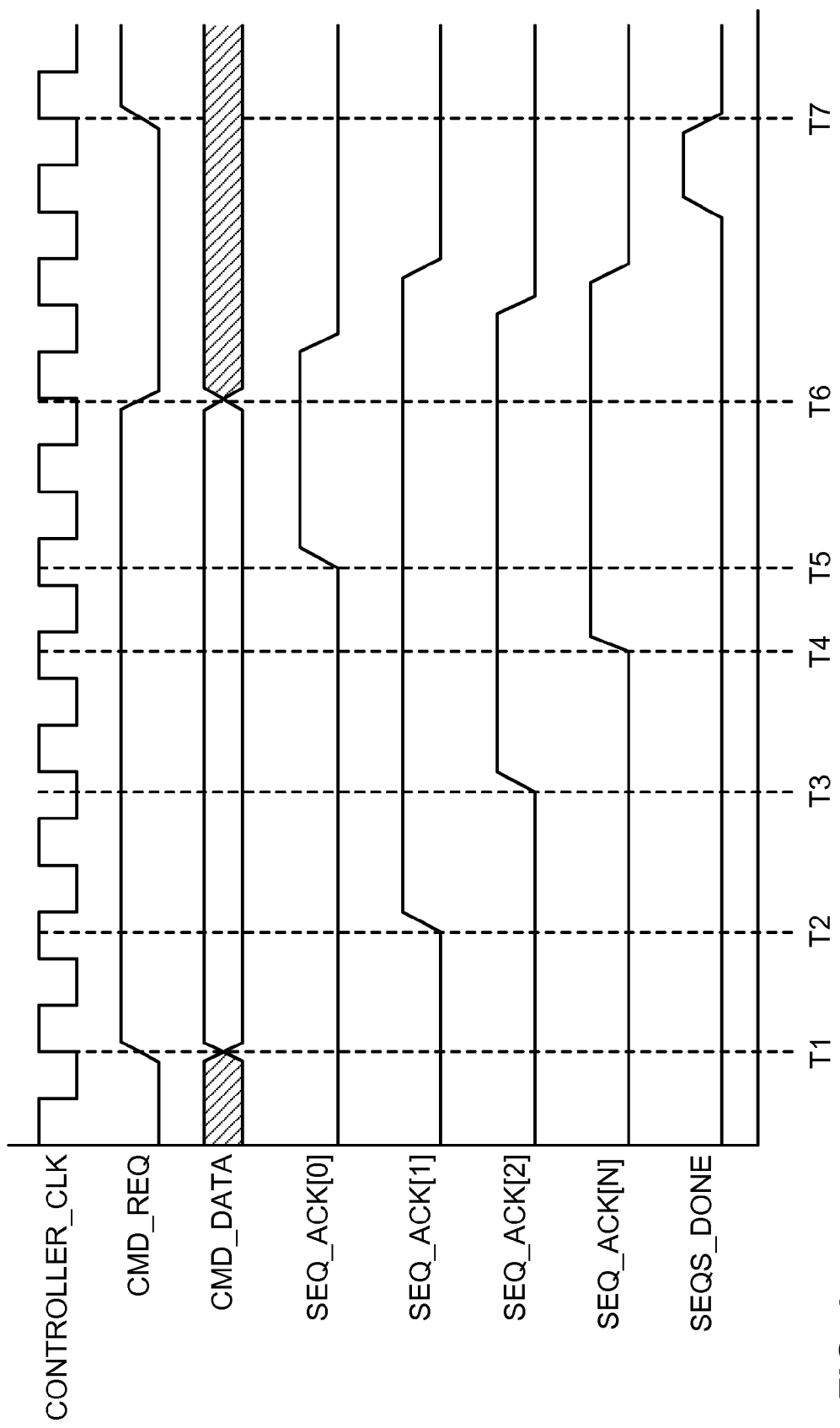
FIG. 3 is a timing diagram that further illustrates communication between the BIST controller and a set of sequencers for a single command of a generic BIST algorithm.

FIG. 3 is a timing diagram that further illustrates communication between BIST controller 4 and sequencers 8 for a single command of a generic BIST algorithm. As illustrated, at a time T1, BIST controller 4 asserts the command request (CMD_REQ) interconnects, and communicates a current command of the algorithm on the CMD_DATA interconnects.

Upon receiving and applying the command, sequencers 8 assert a corresponding SEQ_ACK signal. For example, in the illustrated example, each of sequencers 8 assert respective signals SEQ_ACK[1], SEQ_ACK[2], SEQ_ACK[N] and SEQ_ACK[0] at times T2, T3, T4 and T5, respectively. In response, BIST controller 4 de-asserts the command request (CMD_REQ) signal at a time T6, causing sequencers 8 to de-assert their respective SEQ_ACK signal. BIST controller 4 asserts SEQS_DONE signal when all SEQ_ACK signals have been de-asserted, allowing BIST controller 4 to initiate another command at a time T7.

Figure 4:
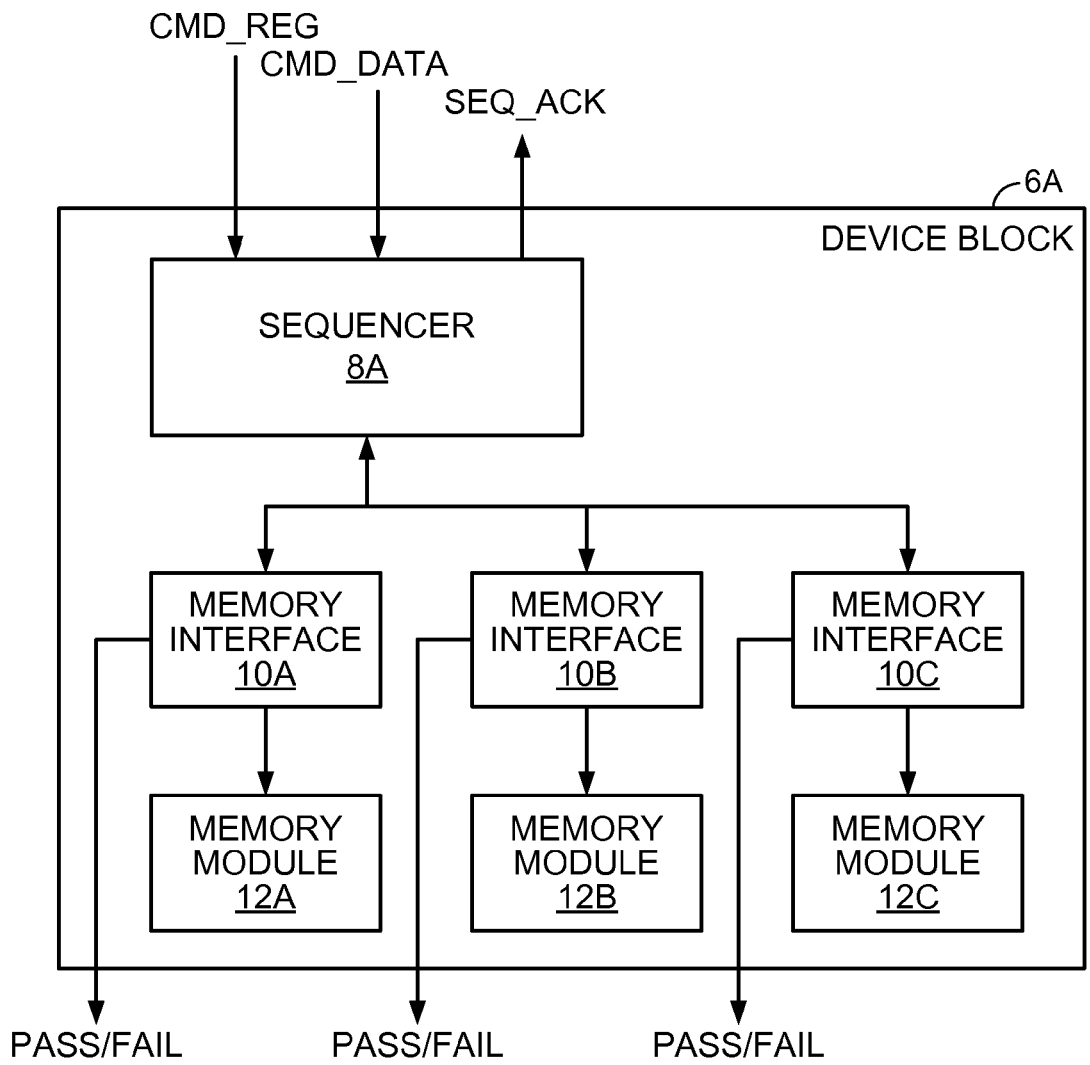
FIG. 4 is a block diagram illustrating an example embodiment of a device block.

FIG. 4 is a block diagram illustrating an example embodiment of a device block, e.g., device block 6A, in more detail. As illustrated, device block 6A includes sequencer 8A, a set of memory interfaces 10A-10C (collectively "memory interfaces 10"), and a set of memory modules 12A-12C (collectively "memory modules 12"). As illustrated in FIG. 4, each of memory interfaces 10 corresponds to a respective memory module 12. Sequencer 8A may be programmatically and/or statically configured to establish the number of memory interfaces 10 to be controlled, as well as the characteristics, e.g., maximum address, for the largest of memory modules 12.

Figure 5:
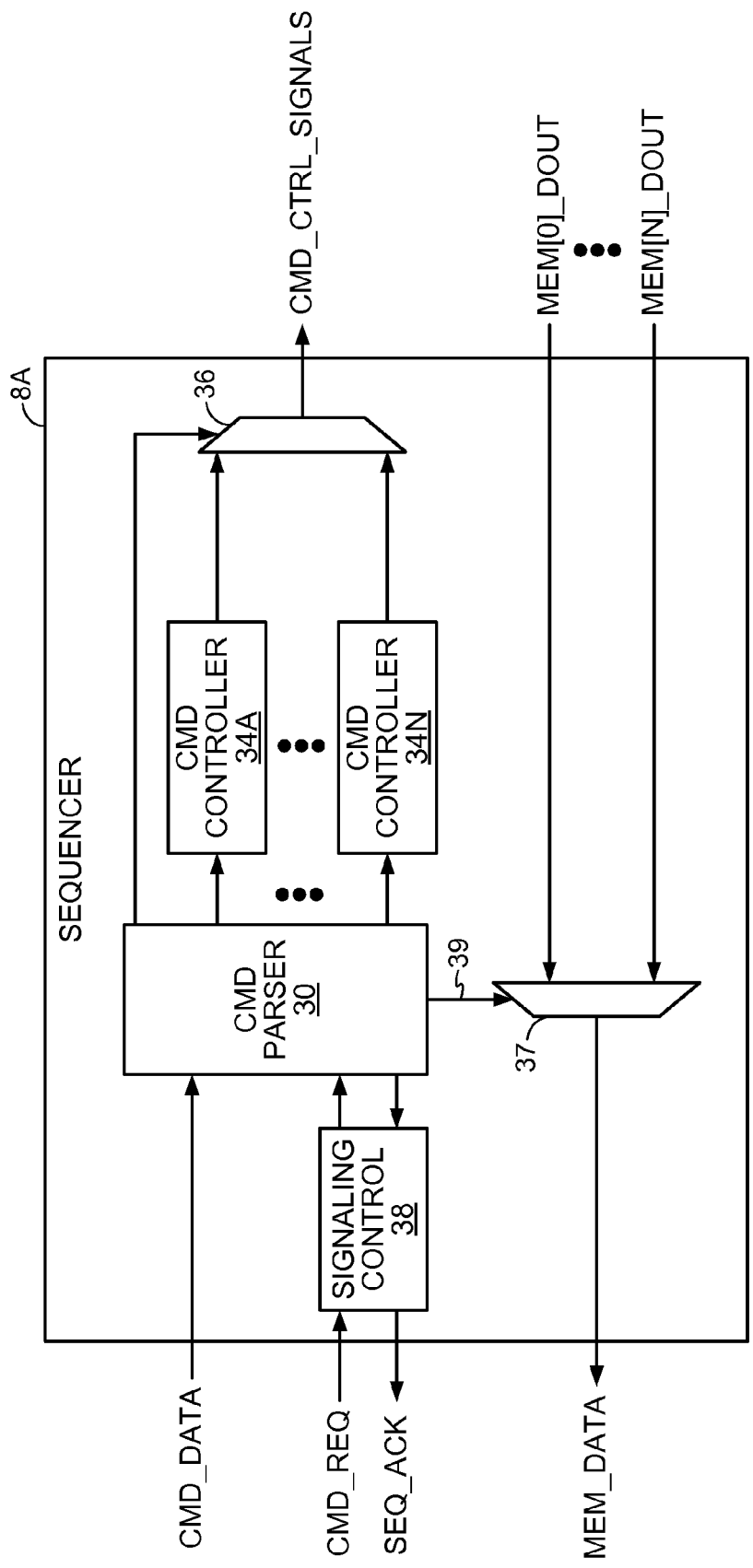
FIG. 5 is a block diagram illustrating an example embodiment of a sequencer.

FIG. 5 is a block diagram illustrating an example embodiment of a sequencer, e.g., sequencer 8A, in more detail. Sequencer 8A receives high-level commands from BIST controller 4 that collectively define a BIST algorithm. As illustrated in detail below, BIST controller 4 issues the commands in a generic, flexible format, and a single command may define a particular bit pattern to be written over a range of one or more addresses.

In general, sequencer 8A receives the generic BIST commands, and controls the application of each command as a sequence of one or more memory operations applied to a set of respective memory modules. In the illustrated embodiment, sequencer 8A includes a command parser (CMD PARSER) 30 that receives command data (CMD_DATA) from BIST controller 4. Command parser 30 processes the received command to identify the specified operation, e.g., by identifying an operational code (op-code) specified by the command.

Based on the specified operation, command parser 30 may extract one or more parameters from the command, and select a corresponding one of command controllers (CMD CONTROLLER) 34A-34N. In other words, each one of command controllers 34 corresponds to a different command that may be specified by CMD_DATA. Command parser 30 invokes the selected command controller 34, and passes the parameters extracted from the received command. Although illustrated separately, command controllers 34 may be combined and/or integrated into a single functional block having logic to perform each of the supported commands.

In response to each command, the invoked one of command controllers 34 issues a sequence of one or more operations to each memory interface 10. In particular, the invoked one of command controllers 34 sequentially drives the appropriate command control signals (CMD_CTRL_SIGNALS) to carry out each operation of the sequence. The command control signals may include signals to provide a memory address and data to the receiving memory interfaces 10 and to direct the receiving memory interfaces to invert bits, perform read or write operations, invert rows, and the like, as further described below.

Moreover, command controller 34 controls the application of the operations in accordance with the timing characteristics of their respective memory modules 12. Consequently, logic for controlling application timing and sequencing of the operations for memory modules 12 operating on a common clock domain may be incorporated within a common sequencer 8, and need not distributed within the individual memory modules.

Sequencer 8A receives data from the tested memory modules 12, e.g., via signals MEM[0]_DOUT throughout MEM[N]_DOUT, and selectively communicates the data back to BIST controller 4 or an external device via multiplexer 37 and data selection signal 39. In this manner, sequencers 8 allow for the analysis of the data to identify any failures.

Thus, sequencers 8 allow BIST controller 4 to centrally manage the storage and issuance of algorithms using generic and flexible command format. Sequencers 8 receive the generic BIST commands in accordance with the command protocol, and control the application of the commands by generating and issuing sequences of one or more memory operations for application to a set of respective memory modules 12, thereby providing a second tier of the distributed, hierarchical self-test architecture.

Figure 6:
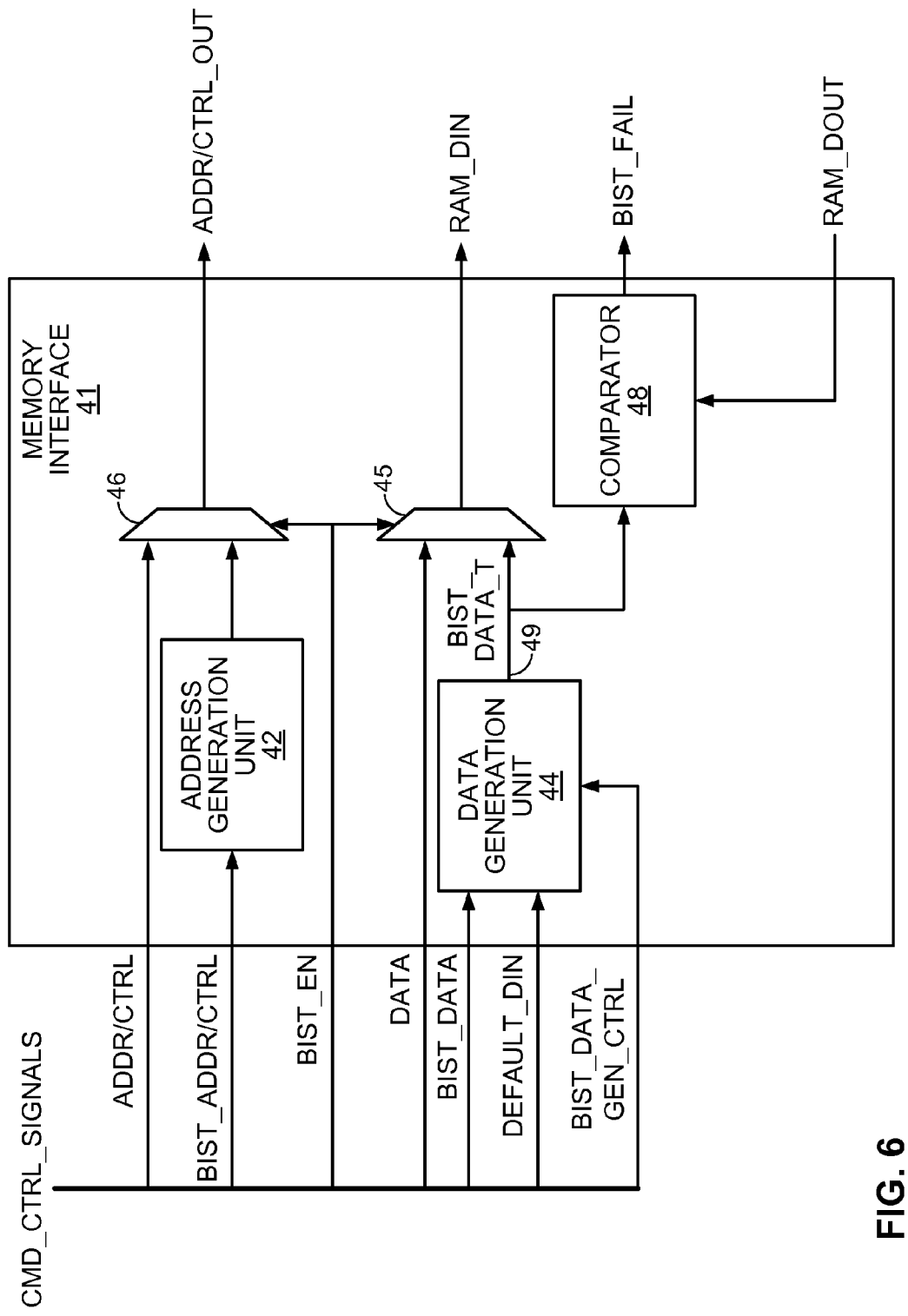
FIG. 6 is a block diagram illustrating an example embodiment of a memory interface.

FIG. 6 is a block diagram illustrating an example embodiment of a memory interface 41 that provides the final layer of abstraction of the distributed BIST architecture by handling specific interface requirements for a respective memory module 12.

In the illustrated embodiment, memory interface 41 includes a layer of multiplexers 45, 46 that isolates the memory module 12 from normal functionality when electronic device 2 is operating in BIST mode. In particular, under normal operating conditions, BIST enable (BIST_EN) is de-asserted, causing multiplexers 45, 46 to select the address/control signals (ADDR/CTRL) and data signals (DATA), e.g., as provided by a programmable processor. When electronic device 2 is operating in BIST mode, however, the BIST enable signal causes multiplexers 45, 46 to select the BIST address/control signals (BIST_ADDR/CTRL) and the test data provided by a respective higher-level sequencer. In this manner, the sequencer controls multiplexers 45, 46 of memory interface 41 to selectively isolate the respective memory module, thereby allowing BIST algorithms to be applied to that memory module.

Memory interface 41 further includes a data generation unit 44 that receives BIST_DATA signals and default data (DEFAULT_DIN) as provided by the sequencer 8, and generates transformed BIST data signals 49 (BIST_DATA_T) based on control signals (BIST_DATA_GEN_CTRL) provided by the sequencer and the specific physical characteristics of the corresponding memory module 12. More specifically, as described in further detail below, data generation unit 44 generates the exact data (RAM_DIN) applied to the memory inputs during each operation of the algorithm. Data generation unit 44 generates the transformed BIST data based on the physical configuration, e.g., physical row and column configuration, of the respective memory module 12, as well as the bit pattern specified by sequencer 8A, e.g., checkerboard, inverted, and the like.

For example, sequencer 8 may request a checkerboard bit pattern that requires columns of data within the memory module to alternate between ones and zeros. Different memory modules 12, however, may be arranged with different row and column configurations. As a result, the memory cell for a given address may be located in a different row and column for memory modules 12 having different row-column configurations. For example, a 256 bit memory module 12 may be organized as 128 rows and 2 columns, 32 rows by 8 columns, 16 rows by 16 columns, and the like. As a result, writing a particular pattern throughout this matrix, such as a checkerboard pattern, requires knowledge of the specific row-column configuration of the memory module. Data generation unit 44 processes the data provided by the sequencer 8, and transforms that data, e.g., inverts the data, as needed to ensure the desired bit pattern is correctly written, as described in further detail below.

Similarly, address generation unit 42 generates the address applied to the memory module 12 based on the addressing requirements specified by sequencer 8A and the physical configuration of the rows and columns of the memory module. For example, in some BIST tests, sequencer 8A directs memory interface 41 to write BIST data in a row (or column) first fashion, i.e., requiring each row (or column) to be completely written before proceeding to the next row (or column). As these requirements are specific to the row and column configuration, address generation unit 42 transforms the address provided by sequencer 8A to an appropriate to traverse an entire row (or column) before proceeding.

As a result, the sequencer is able to issue operations by sequentially traversing an address space defined by the respective command, limited by the maximum-sized memory module associated with that sequencer. Each memory interface, e.g., memory interface 41, transforms the received address as needed to apply the operation to an appropriate memory cell. For example, for a column first BIST algorithm, the sequencer 8 issues the operations to the addresses in sequence, while address generation unit 42 computationally transforms the received address to access memory cells that fall within along the columns of the memory module 12. In this example, address generation unit 42 transforms the addresses to access the memory module 12 in a column-wise fashion from a lowest-significant column to a highest-significant column based on whether the sequencer 8 is incrementing or decrementing through the address space.

Comparator 48 that determines whether the data (RAM_DOUT) read from the memory module 12 equals the data last written to that address of the memory module as expected. When the comparison fails, i.e., when the data read from the memory module 12 does not equal the previously written data, comparator 48 asserts the BIST_FAIL signal to indicate that a memory error has been detected.

In this manner, memory interface 41 processes the sequential memory operations issued by the higher-level sequencer, and transforms the data and addresses provided by the sequencer as needed based on the particular physical characteristics of the memory module, thereby providing a third tier of the distributed, hierarchical self-test architecture. As a result, the sequencer is able to issue operations for complex BIST algorithms without requiring detailed knowledge regarding the physical characteristics and capacities of each memory module 12.

Figure 7:
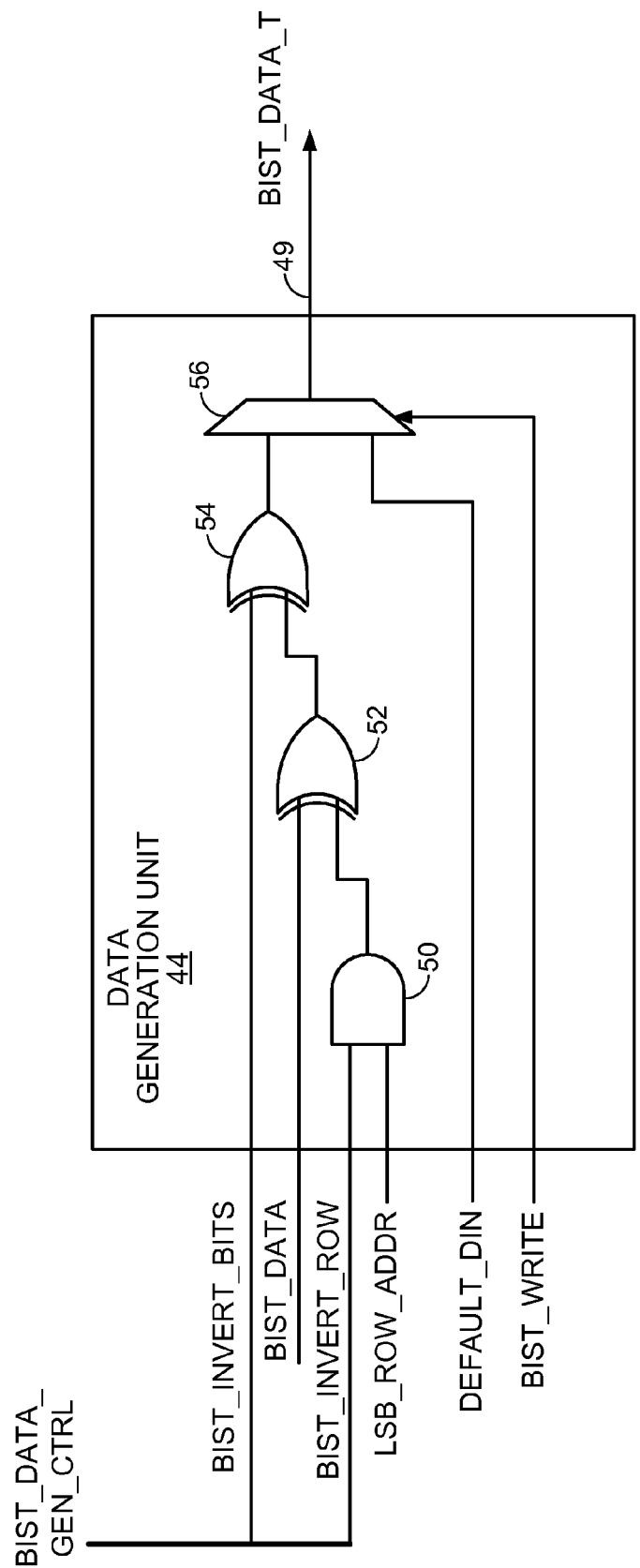
FIG. 7 is a block diagram that illustrates an example embodiment of a data generation unit.

FIG. 7 is a block diagram that illustrates an example embodiment of data generation unit 44 (FIG. 6). In the illustrated embodiment, data generation unit 44 receives a BIST_DATA signal, a default data signal (DEFAULT_DIN) provided by the sequencer 8. In addition, data generation unit 44 receives a number of control signals in the form of BIST_INVERT_BITS, BIST_INVERT_ROWS, LSB_ROW_ADDR, and BIST_WRITE. Based on the received data and these control signals, data generation unit 44 generates transformed BIST data signals 49 (BIST_DATA_T) based on control signals (BIST_DATA_GEN_CTRL) provided by the sequencer 8 and the specific physical characteristics of the corresponding memory module 12.

In particular, the sequencer 8 asserts and deasserts the invert bits signal (BIST_INVERT_BITS), the invert rows signal (BIST_INVERT_ROWS), and the invert columns signal (not shown) to specify data patterns, such as solid, checkerboard, horizontal and vertical striped data patterns. If neither the invert bits nor the invert rows signals are asserted, then the BIST_DATA signal passes through XOR gates 52, 54 without modification. As a result, data generation unit 44 generates the transformed data signal 49 (BIST_DATA_T) to fill the memory module 12 with the data dictated from the sequencer 8 without modification.

If the BIST_INVERT_ROW signal is set then data generation unit 44 inverts the values every time a row is crossed, as indicated by the least significant row address bit (LSB_ROW_ADDR). As a result, AND gate 50 causes XOR gate 52 to invert the values dictated by the sequencer, and thereby invert values written to neighboring rows. Similar functionality may be provided to invert values as columns are crossed. When the BIST_INVERT_BITS signal is asserted, data generation unit 44 automatically inverts the values dictated by the sequencer. This may be useful in inverting values between corresponding cells of the different matrices.

The DEFAULT_DIN field establishes a default data value applied to the memory modules during read operations for memory modules 12. Multiplexer 56 selects between the DEFAULT_DIN data and the data generated by XOR gate 54 based on whether a write or a read operation is being performed, as indicated by the BIST_WRITE signal.

FIG. 8 is a block diagram illustrating an example data structure of a command issued by BIST controller 4. In the illustrated embodiment, command 60 includes a sequencer identifier (ID) 62, and a payload 64. Sequencer ID 62 identifies a sequencer, e.g., sequencer 8A, to which command 60 is being issued, as described in further detail below.

BIST controller 4 broadcast commands to all sequencers 8, or may issue a command in unicast fashion to a particular one of the sequencers. In particular, BIST controller 4 sets sequencer ID 62 to a unique identifier for one of sequencers 8 to send a unicast command to that sequencer. For a broadcast command, BIST controller 4 sets sequencer ID 62 to a broadcast identifier, such as 0x0.

Payload 64 of command 60 carries binary data that defines the command itself. In particular, payload 64 includes an operational code (OP CODE) 66 and a set of parameters 68. In general, OP CODE 66 specifies a particular function to be performed by the receiving sequencers 8. The following table enumerates an exemplary set of operational codes:

TABLE 1

| CMD | OP CODE | MESSAGE TYPE | DESCRIPTION |
| --- | --- | --- | --- |
| RESET | 000 | Broadcast or Unicast | Resets the sequencer(s) and selectively enable BIST mode. |
| EXECUTE | 001 | Broadcast or Unicast | Apply a defined sequence of one or more memory operations as specified by the parameters of the command. |
| TRIGGER STORED TEST | 010 | Broadcast or Unicast | Initiate a specified test algorithm stored within a specific sequencer. |
| TEST MEM | 011 | Unicast | Used to select a particular memory module within a device block for participating in a test or for failure analysis. |
| SET ADDRESS | 100 | Unicast | Sets a specific starting address as well as a maximum address limit for a test algorithm as applied to the memory modules. |
| SINGLE WORD ADDRESS | 101 | Broadcast or Unicast | Executes one or more operations on the address specified by the current BIST address of the sequencer. May increments or decrements after access. |

In one embodiment, OP CODE 66 and parameters 68 comprise three bits and twenty-nine bits, respectively, to form a 32-bit command. The format and meaning of parameters 68 is dependent upon the type of command, as specified by OP CODE 66.

FIG. 9A illustrates an example data structure of parameters 68 for the RESET command. As illustrated, the only relevant bit of parameters 68 is bit 28, which can be asserted or de-asserted to selectively enable and disable BIST mode. When asserted, the receiving sequencers 8 enter a mode for applying test algorithms to test the respective device blocks 6. When de-asserted, the receiving sequencers reset and terminate the current algorithm.

FIG. 9B illustrates an example data structure of parameters 68 for the EXECUTE command. As illustrated, for the EXECUTE command, parameters 68 directs the receiving sequencers 8 to apply a sequence of memory operations over a range of addresses in accordance with the particular timing characteristics of their respective memory modules 12.

Once received, by default, sequencers 8 repetitively execute the specified memory operation over the address range of the largest memory module 12 within the respective device block 6. However, if SINGLE ROW (SR) bit is enabled, sequencers 8 execute the defined sequence of memory operations for all columns of the memory module 12 that has the largest column-bit option while maintaining the row address constant.

When applying the sequence of memory operations, sequencers 8 either increment or decrement through the address range supported by the largest of the memory modules 12 within their respective device blocks 6 based on the state of the ADD INC/DEC bit of parameters 68. If ADD INC/DEC is asserted, for example, sequencers 8 apply the defined memory operations to each address starting from zero and proceeding to the maximum addresses. If ADD INC/DEC is deasserted, however, sequencers 8 apply the defined memory operations to each address starting from the maximum address and decrementing to zero. The DEF DIN field establishes a default data value applied to the memory modules 12 during read operations for the memory modules.

The rippling row (RR) field directs sequencer 8 to apply the defined memory operations in a column-wise fashion, i.e., by applying the operations to an entire column before proceeding to the next column. In other words, each of sequencers 8 hold the column address constant while applying the memory operations and "rippling" the row address.

The invert bits (IB) field, invert rows (IR), and invert columns (IC) fields can be used to specify data patterns for testing memory modules 12, such as solid, checkerboard, horizontal and vertical stripes data patterns. More specifically, if BIST controller 4 does not set either of the IR and IC fields, then the receiving sequencers 8 direct the memory interfaces 10 to fill memory modules 12 with the values dictated from the sequencer. If the IR field is set, then the values dictated by the sequencers 8 will have inverted values written to neighboring rows. Similarly, if the IC field is set, then the values dictated by the sequencers 8 will have inverted values written to neighboring columns. As a result, if both the IR field and the IC field are set, values are inverted between each column and between each row to create a checkerboard pattern within the memory modules. Finally, as described above, a given memory module 12 may be configured as more than one matrix. If the invert bits (IB) field is set, then the memory interfaces 10 automatically invert the values dictated by sequencer 8 between corresponding cells of the different matrices.

Operations fields (OP1-OP8) can be used to define a set of operations to be applied to each memory address. For example, each operation field, such as OP1, may comprise two bits. The first bit may be asserted or deasserted to indicate whether the operation is a read or a write. The second bit may be set based on the data to be written, i.e., a zero or a one. The number of operations (NUM OPS) field instructs sequencers 8 as to how many operations have been defined for application to each memory address. In this manner, a single command may be used to generically define a step within an overall BIST algorithm, and each step may define one or more operations to be applied to each address of the memory modules 12 with device blocks 6 of the receiving sequencers 8.

FIG. 9C illustrates an example data structure of parameters 68 for the TEST MEM command. For this command, parameters 68 include an FA/BIST bit to interpret the TEST MEM command as a failure analysis command and as a BIST command. When set to failure analysis command, the value specified by the MEM ID field is used by the receiving sequencers 8 to select the data output of a specific one of memory modules 12 for failure analysis. When set to a BIST command, the value specified by the MEM ID field is used by the receiving sequencers 8 to select the data output of a specific one of memory interface 10 for participation within a particular test. In this manner, the algorithm can be selectively applied to individual memory modules 12 within a device block 6. The MEM BUS SLICE field is used to indicate which portion of the multiplexed data bus from the memory modules 12 is used for the failure analysis.

FIG. 9D is an example data structure of parameters 68 for the SET ADDRESS command. For this command, parameters 68 includes and address field (ADDRESS) that sets a specific memory address for application of a BIST step. This may be useful in conjunction with the SINGLE WORD ACCESS command. Parameters 68 also include a limit (LIMIT) field for specifying a maximum address limit for the test algorithm. In one embodiment, the LIMIT field comprises a 2-bit data field for setting the limit to: (1) the maximum address of the largest of the memory modules 12 of the device block 6, (2) the maximum address divided by two, (3) the maximum address divided by four, and (4) the maximum address divided by eight.

Figure 9E:
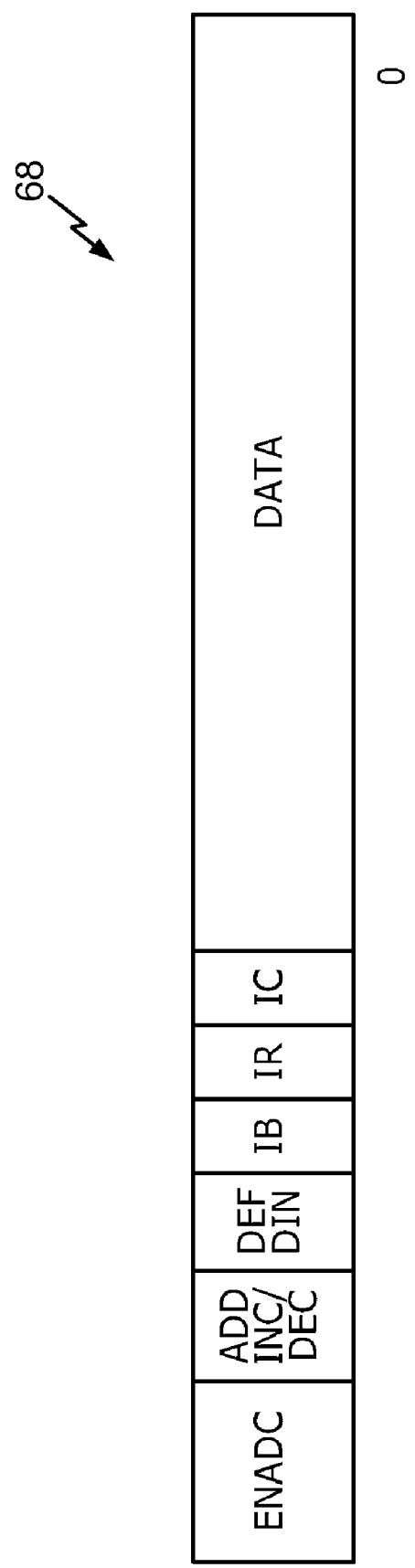

FIG. 9E is an example data structure of parameters 68 for the SINGLE WORD ACCESS command. For this command, parameters 68 includes an enable address change (ENADC) bit that controls whether the receiving sequencers 8 should change their respective current BIST addresses after applying the step. If enabled, the address increment/decrement (ADD INC/DEC) bit controls whether the current BIST address should be incremented or decremented. The invert bits (IB) field, invert row (IR), and invert column (IC) fields can be used to specify data patterns for testing memory modules 12, such as solid, checkerboard, horizontal and vertical stripes data patterns, as described above in reference to the EXECUTE command. The data field (DATA) is used to supply a default value for input data for read operations of the tested memory modules 12.

Table 2 illustrates an example checkerboard BIST algorithm stored and issued by BIST controller 4 in accordance with the described command protocol. As illustrated, a relatively complex checkerboard memory test algorithm can be described in as few as four commands using the command protocol.

TABLE 2

| Op-code | Parameters | Industry Notation | Description |
| --- | --- | --- | --- |
| 010 | 01000011000000000000000 | $\hat{}$(W01) | Sequence from 0 to MAX ADDR/write alternating '0', '1' |
| 010 | 01000011100000000000000 | $\hat{}$(R01) | Sequence from 0 to MAX ADDR/read alternating '0', '1' |
| 010 | 01000011101000000000000 | $\hat{}$(W10) | Sequence from 0 to MAX ADDR/write alternating '1', '0' |
| 010 | 01000011111000000000000 | $\hat{}$(R10) | Sequence from 0 to MAX ADDR/read alternating '1', '0' |

Table 3 illustrates an example "Blanket March" BIST algorithm stored and issued by BIST controller 4 in accordance with the described command protocol. As illustrated, this memory test algorithm can be described in as few as six commands using the command protocol. Each of the commands directs the receiving sequencers 8 to issues sequences of memory operations that traverse the entire memory space in a defined direction. Moreover, several of the commands direct the sequencers to apply multiple memory operations to each address within the available memory space. In this manner, complex BIST algorithms can be easily distributed throughout and applied by the constituent components of the hierarchical self-test architecture.

TABLE 3

| Op-code | Parameters | Industry Notation | Description |
|---|---|---|---|
| 010 | 01010000000000000000000000 | Din=0^(W0) | Sequence from 0 to MAX ADDR/write '0' |
| 010 | 01110000011100110100000000 | Din=0^(R0,W1,R1,W1) | Sequence from 0 to MAX ADDR, rippling-row/read '0', write '1', read '1', write '1' |
| 010 | 01111000011110010000000000 | Din=0^(R1,W0,R0,W0) | Sequence from 0 to MAX ADDR, rippling-row/read '1', write '0', read '0', write '0' |
| 010 | 00110000011100110100000000 | Din=0v(R0,W1,R1,W1) | Sequence from MAX ADDR to 0, rippling-row/ read '0', write '1', read '1', write '1' |
| 010 | 00111000011110010000000000 | Din=0v(R1,W0,R0,W0) | Sequence from MAX ADDR to 0, rippling-row/ read '1', write '0', read '0', write '0' |
| 010 | 01010000001000000000000000 | din=0^(R0) | Sequence from 0 to MAX ADDR/read '0' |

Figure 10:
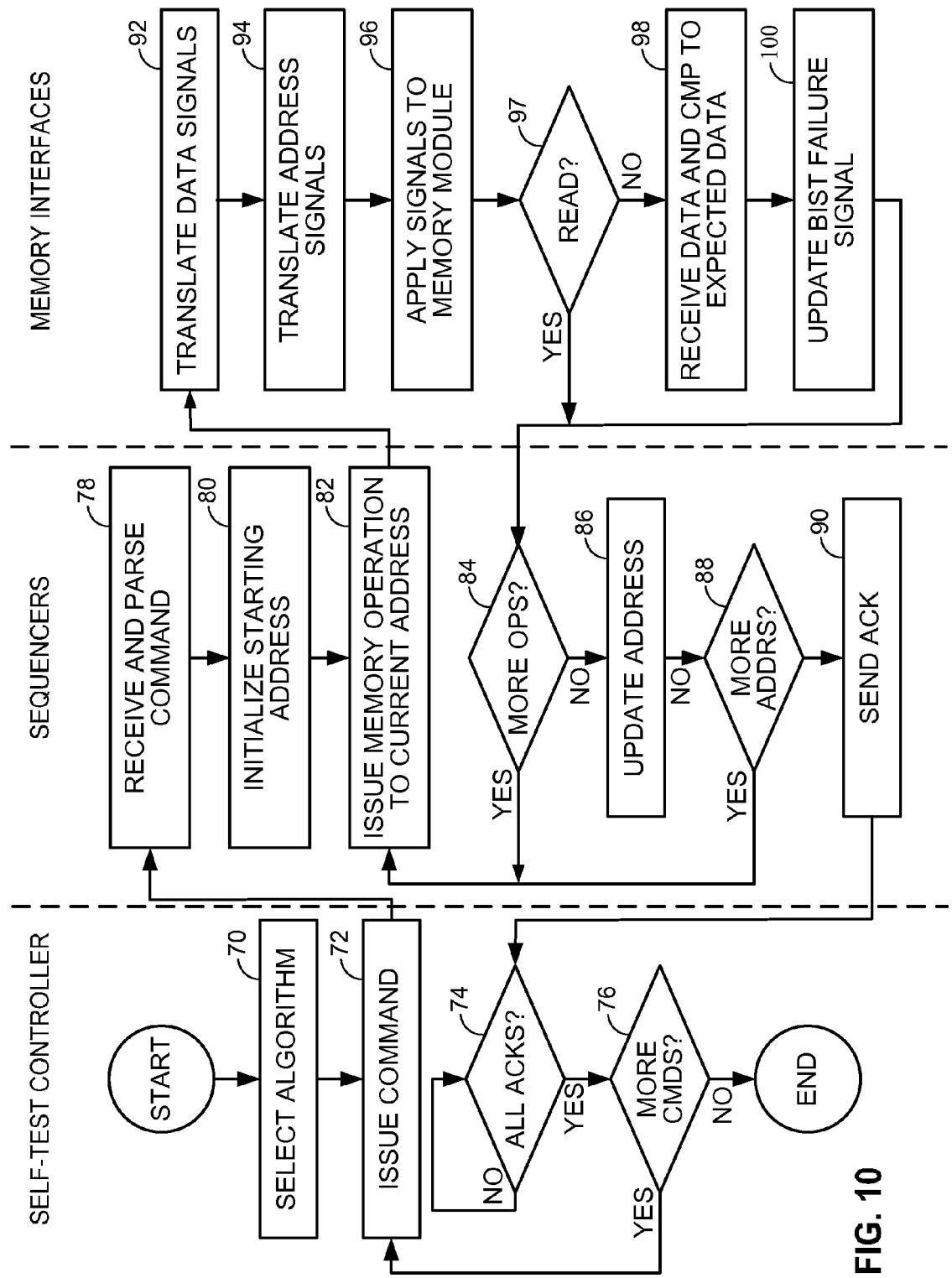
FIG. 10 is a flowchart illustrating example operation of the distributed, three-tier self-test architecture.

FIG. 10 is a flowchart illustrating example operation of the electronic device 2 and, in particular, the distributed, three-tier self-test architecture of BIST controller 4, sequencers 8, and memory interfaces 10.

Initially, BIST controller 4 selects one of the algorithms stored within an internal algorithm memory, e.g., algorithm memory 20 (70). Upon selecting the algorithm, BIST controller 4 issues the first command defined by the algorithm to one or more of sequencers 8 (72).

Each receiving sequencer 8 parses the command to identify the defined op-code and corresponding parameters (78). For memory access commands, each receiving sequencer 8 initializes a starting address defined by the command (80). Next, sequencer 8 issues a memory operation, i.e., generates the appropriate address, data and control signals (82).

In turn, each receiving memory interface 10 translates the data and address signals based on the physical characteristics of each respective memory module 12 (92, 94), and applies the translated signals to the memory modules (96). In addition, for read memory accesses (97), memory interfaces 10 automatically compares the data read from the respective memory modules 12 with the expected data (98). Based on the comparison, memory interfaces 10 update respective BIST failure signals to report the status of the tested memory module 12 (100).

Once the memory operation has been issued by the memory interfaces 10, sequencers 8 determine if additional operations are to be applied to the current memory address within the sequence (84). If so, sequencers 8 issue the commands to memory interfaces 10 in similar fashion (82). If additional operations are not required, sequencers 8 update the address (86) and determine whether the entire address range defined by the command has been sequenced or whether additional addresses remain (88). When the entire address range has been sequenced and the memory operations have been applied to the addresses within the range, sequencers 8 issue acknowledge signals to BIST controller 4 (90).

Upon receiving acknowledgements from each of sequencers 8 targeted with the command (74), BIST controller 4 determines whether the last command for the selected algorithm has been issued. If not, BIST controller 4 repeats the process and issues the additional commands (72). Once all of the commands have been issued and applied by sequencers 8 and memory interfaces 10 (76), BIST controller 4 terminates the current BIST test.

Various embodiments have been described. These and other embodiments are within the scope of the following claims.

What is claimed is:

1. A system comprising:
a centralized built-in self-test (BIST) controller configured to store an algorithm to test a plurality of memory modules, wherein the BIST controller stores the algorithm as a set of generalized commands that conform to a command protocol;
wherein the BIST controller is configured to send the set of generalized commands to a sequencer.

2. The system of claim 1, wherein the sequencer is configured to apply the algorithm to at least one of the plurality of memory modules.

3. The system of claim 2, wherein the sequencer is further configured to interpret the set of generalized commands according to the command protocol.

4. The system of claim 2, wherein the set of generalized commands specify the algorithm without regard to physical characteristics of the memory modules.

5. The system of claim 1, wherein the BIST controller is configured to store a plurality of algorithms to test the memory module.

6. The system of claim 5, wherein at least one of the stored algorithms is received via external input.

7. The system of claim 1, wherein each of the generalized commands includes a sequencer identifier that identifies one or more sequencers to process the respective command and apply the command to one or more associated memory modules.

8. The system of claim 1, wherein the BIST controller comprises an algorithm controller, wherein the algorithm controller is configured to be invoked in response to an external input or to be automatically invoked upon power-up.

9. The system of claim 1, wherein after the BIST controller has sent the set of generalized commands to the sequencer, the BIST controller is further configured to send at least one of the set of generalized commands to another sequencer.

10. The system of claim 1, wherein the BIST controller is programmatically configured to apply the algorithm using a selected combination of sequencers.

11. An apparatus comprising:
a sequencer, the sequencer configured to receive an algorithm from a built-in self-test (BIST) controller, wherein the algorithm comprises a set of generalized commands that conform to a command protocol;
wherein the sequencer is further configured to interpret the commands based on the command protocol and to apply the algorithm to an associated memory module.

12. The apparatus of claim 11, wherein the algorithm comprises a test algorithm.

13. The apparatus of claim 11, wherein the sequencer is further configured to apply the algorithm to a plurality of memory modules.

14. The apparatus of claim 13, wherein each of the plurality of memory modules operates on a common clock domain.

15. The apparatus of claim 13, wherein the sequencer further comprises logic to control application timing of the algorithm.

16. The apparatus of claim 13, wherein the plurality of memory modules is selected based on a pre-existing grouping or a pre-existing hierarchy of memory modules.

17. A method comprising sending an algorithm from a centralized controller by issuing generalized commands that conform to a command protocol to test a plurality of memory modules, wherein the commands are interpreted by a distributed set of sequencers to apply the commands as one or more sequences of memory operations in accordance with the command protocol.

18. The method of claim 17, wherein each sequencer is operative to control an application of the memory operations to a corresponding set of memory modules.

19. The method of claim 18, wherein each sequencer is operative to control the application of the memory operations in accordance with timing characteristics of the corresponding set of memory modules.

20. The method of claim 19, wherein each memory module of the corresponding set of memory modules operates on a common clock domain.

* * * * *